(12) United States Patent
Lee et al.

(10) Patent No.: US 8,987,716 B2
(45) Date of Patent: Mar. 24, 2015

(54) ORGANIC LIGHT-EMITTING DIODE (OLED) DISPLAY DEVICE AND METHOD OF MANUFACTURING THE SAME

(71) Applicant: LG Display Co., Ltd., Seoul (KR)

(72) Inventors: Se-Hee Lee, Gyeongsangbuk-do (KR); Sun-Kap Kwon, Namyangju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/708,094

(22) Filed: Dec. 7, 2012

(65) Prior Publication Data

US 2013/0146853 A1 Jun. 13, 2013

(30) Foreign Application Priority Data

Dec. 9, 2011 (KR) .................... 10-2011-0131589

(51) Int. Cl.
*H01L 51/52* (2006.01)
*H01L 51/56* (2006.01)
*H01L 27/32* (2006.01)
*H01L 51/00* (2006.01)
*H01L 51/50* (2006.01)

(52) U.S. Cl.
CPC ........ *H01L 27/3216* (2013.01); *H01L 51/0012* (2013.01); *H01L 51/5056* (2013.01); *H01L 51/5265* (2013.01); *H01L 51/5012* (2013.01); *H01L 51/0011* (2013.01)
USPC ........... 257/40; 257/89; 257/E51.022; 438/35

(58) Field of Classification Search
None
See application file for complete search history.

(56) References Cited

U.S. PATENT DOCUMENTS

| 8,183,766 B2 * | 5/2012 | Chao et al. ............. 313/505 |
| 2006/0181202 A1 * | 8/2006 | Liao et al. ............. 313/504 |
| 2007/0046195 A1 * | 3/2007 | Chin et al. ............. 313/506 |
| 2007/0075312 A1 * | 4/2007 | Chin et al. ............. 257/40 |
| 2010/0277403 A1 * | 11/2010 | Chao et al. ............. 345/80 |
| 2013/0140533 A1 * | 6/2013 | Lee et al. ............. 257/40 |

OTHER PUBLICATIONS

BT.709 Parameter valudes for HDTV standards and production and international programme exchange, downloaded from URL<http://www.itu.int/rec/R-REC-BT.709-5-200204-I/en> on Apr. 18, 2014.*
Korean Intellectual Property Office, Office Action, Korean Patent Application No. 10-2011-0131589, Mar. 27, 2014, four pages [with concise explanation of relevancy in English].

* cited by examiner

*Primary Examiner* — Joseph Schoenholtz
(74) *Attorney, Agent, or Firm* — Fenwick & West LLP (57) ABSTRACT

There is provided an organic light-emitting diode (OLED) display device, including: a first substrate on which a plurality of sub-pixel areas are defined; a plurality of first electrodes in the plurality of sub-pixel areas, respectively; and a plurality of light-emitting layers over the plurality of first electrodes and corresponding to the plurality of sub-pixel areas, respectively; wherein at least one of the plurality of light-emitting layers extends to a neighboring sub-pixel area among the plurality of sub-pixel areas, and has an occupied area in the neighboring sub-pixel area.

6 Claims, 9 Drawing Sheets

ORGANIC LIGHT-EMITTING DIODE (OLED) DISPLAY DEVICE AND METHOD OF MANUFACTURING THE SAME

CROSS-REFERENCE TO RELATED APPLICATION

The present application claims the priority benefit of Korean Patent Application No. 10-2011-0131589 filed in the Republic of Korea on Dec. 9, 2011, which is hereby incorporated by reference herein in its entirety.

BACKGROUND

1. Field of the Disclosure

The present disclosure generally relates to an organic light-emitting diode (OLED) display device, and more particularly, to an organic light-emitting diode (OLED) display device capable of displaying images with improved quality and a method of manufacturing the same.

2. Discussion of the Related Art

Recently, a slim, light-weight, flat panel display having low power consumption has been developed and applied to various technical fields.

In an organic light-emitting diode (OLED) display device, charges are injected into a light-emitting layer formed between a cathode electrode which is an electron injection electrode, and an anode electrode which is a hole injection electrode. The injected charges combine with holes in the light-emitting layer to form electron-hole pairs that emit light. The OLED display device can be formed on a flexible substrate such as a plastic substrate, provide excellent colors due to self-luminescence, and also minimize power consumption since it can be driven at a low voltage (below 10 V).

The OLED display device includes red, green, and blue light-emitting layers corresponding to, for example, red, green, and blue sub-pixel areas.

Figure 1:
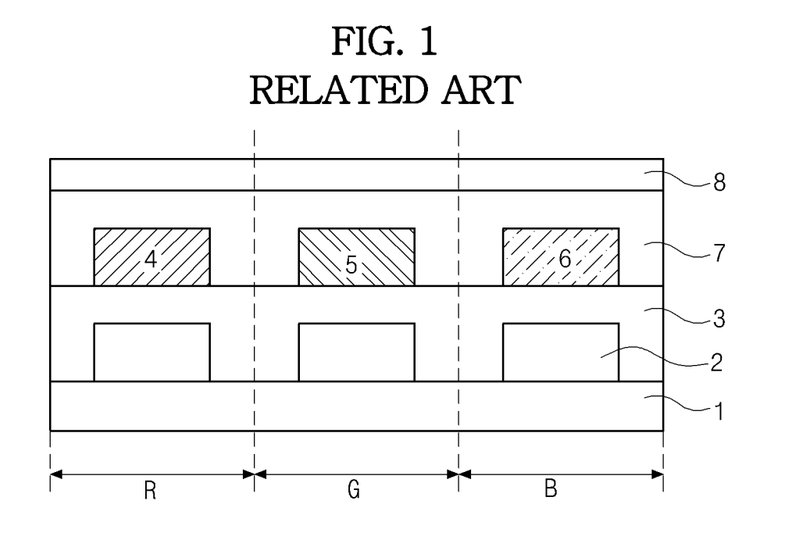
FIG. 1 is a cross-sectional view schematically showing a related art organic light-emitting diode (OLED) display device.

Hereinafter, a related art OLED display device will be described with reference to FIG. 1. FIG. 1 is a cross-sectional view schematically showing a related art OLED display device.

As shown in FIG. 1, red, green, and blue sub-pixel areas R, G, and B are defined on a substrate 1.

Also, on the substrate 1, first electrodes 2 are formed in correspondence to the red, green, and blue sub-pixel areas R, G, and B.

A hole transport layer 3 is formed to cover the entire first electrodes 2.

On the hole transport layer 3, a red light-emitting layer 4, a green light-emitting layer 5, and a blue light-emitting layer 6 are respectively formed in correspondence to the red, green, and blue sub-pixel areas R, G, and B.

An electron transport layer 7 is formed on the red, green, and blue light-emitting layers 4, 5, and 6, and a second electrode 8 is formed on the electron transport layer 7.

Figure 2:
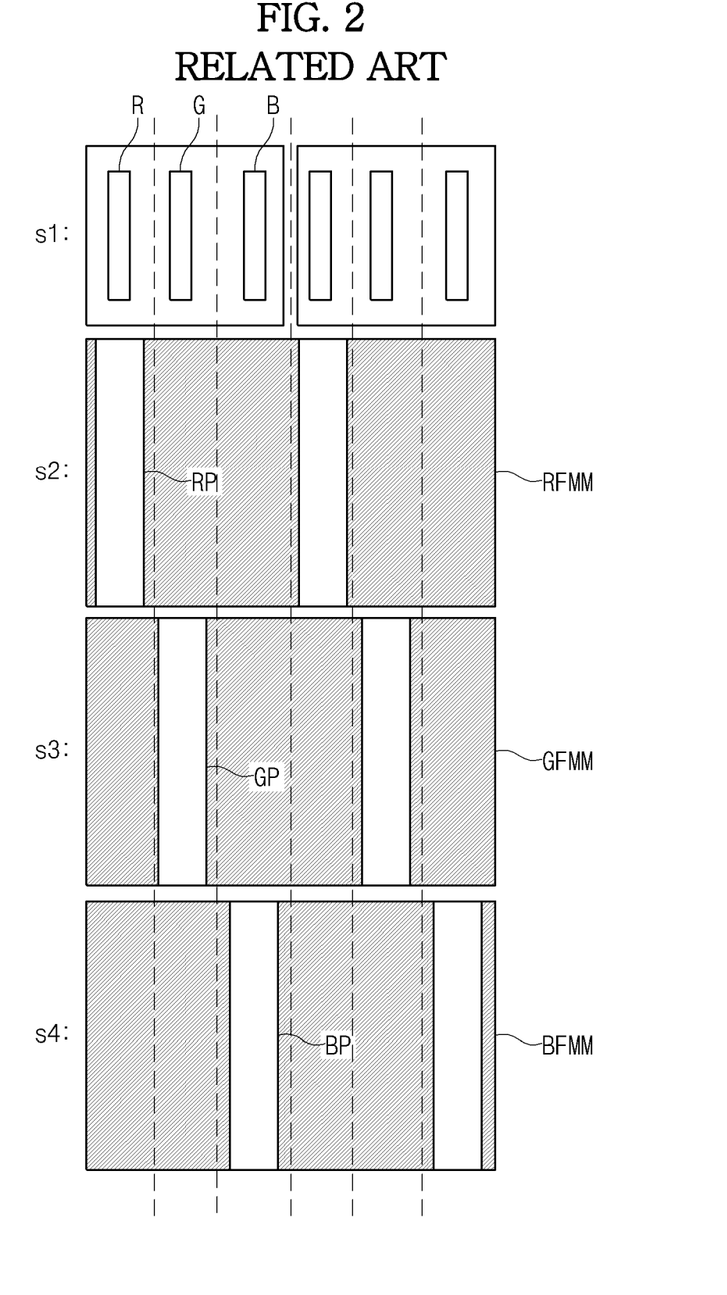
FIG. 2 is a view schematically showing processes of manufacturing the related art OLED display device.

Hereinafter, a method of manufacturing the related art OLED display device will be briefly described with reference to FIG. 2. FIG. 2 is a view schematically showing processes of manufacturing the related art OLED display device. FIG. 2 shows red, green, and blue sub-pixel areas R, G, and B, and red, green, and blue fine metal masks RFMM, GFMM, and BFMM corresponding to the red, green, and blue sub-pixel areas R, G, and B.

Referring to FIG. 2, the respective red, green, and blue fine metal masks RFMM, GRMM, and BFMM have red, green, and blue patterns RP, GP, and BP corresponding to the sub-pixel areas R, G, and B.

First, a substrate (1 of FIG. 1) on which red, green, and blue sub-pixel areas R, G, and B are defined, is prepared (s1), and then red light-emitting layers (4 of FIG. 1) are formed using the red fine metal mask RFMM with the red patterns RP corresponding to the red sub-pixel areas R (s2). Successively, green light-emitting layers (5 of FIG. 1) are formed using the green fine metal mask GFMM with the green patterns GP corresponding to the green sub-pixel areas G (s3), and finally, blue light-emitting layers (6 of FIG. 1) are formed using the blue fine metal mask BFMM with the blue patterns BP corresponding to the blue sub-pixel areas B (s4).

That is, in the related art OLED display device, the respective light-emitting layers 4, 5, and 6 are formed in correspondence to the respective sub-pixel areas R, G, and B. In other words, the sub-pixel areas R, G, and B, 1:1, correspond to the light-emitting layers 4, 5, and 6.

However, the OLED display device does not meet the color coordinate standard ITU-R BT.709 (International Telecommunication Union Radiocommunication sector Broadcasting service Television.709) that represents the color reproduction range of high definition television (HDTV).

Generally, an OLED display device processes images according to the ITU-R BT.709, however, the processed images are transmitted based on the NTSC (National Television Standards Committee) which is an analog image standard, and the color reproduction range of the NTSC is different from the color reproduction range of the ITU-R BT.709.

The following Table 1 shows color coordinator values of the NTSC and ITU-R BT.709, based on coordinator values designated by the CIE (International Commission on Illumination) in 1931.

TABLE 1

| | CIE1931x,y | | | | | |
|---|---|---|---|---|---|---|
| | Red Sub-pixel Area | | Green Sub-pixel Area | | Blue Sub-pixel Area | |
| Standard | x | y | x | y | x | y |
| NTSC | 0.670 | 0.330 | 0.210 | 0.710 | 0.140 | 0.080 |
| ITU-R BT.709 | 0.640 | 0.330 | 0.300 | 0.600 | 0.150 | 0.060 |

The color reproduction range of a related art OLED display device will be described with reference to FIG. 3 and Table 2, below.

Figure 3:
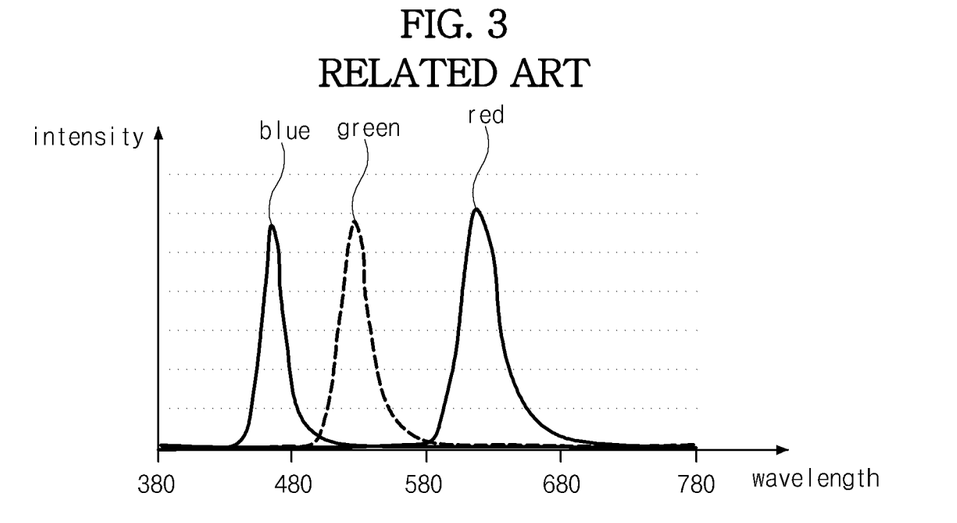
FIG. 3 shows simulation results of luminescence spectrums of red, green, and blue sub-pixel areas in the related art OLED display device.

FIG. 3 shows simulation results of luminescence spectrums of the red, green, and blue sub-pixel areas in the related art OLED display device, and Table 2 shows ITU-R BT.709 color coordinate values that represent the color reproduction ranges of the red, green, and blue sub-pixel areas of the related art OLED display device, wherein the color coordinate values of the ITU-R BT.709 are based on coordinator values designated by the CIE in 1931.

As shown in FIG. 3, a blue sub-pixel area (B of FIG. 1) has a luminescence peak at a wavelength of about 450 nm, a green sub-pixel area (G of FIG. 1) has a luminescence peak at a wavelength of about 550 nm, and a red sub-pixel area (R of FIG. 1) has a luminescence peak at a wavelength of about 630 nm.

Also, the color coordinate values of the red, green, and blue sub-pixel areas (R, G, and B of FIG. 1), as shown in Table 2 for the OLED display device, are significantly different from the color coordinate values of the ITU-R BT.709.

TABLE 2

|  | x | y |
|---|---|---|
| Red Sub-pixel Area | 0.67 | 0.33 |
| Green Sub-pixel Area | 0.19 | 0.75 |
| Blue Sub-pixel Area | 0.14 | 0.06 |

Accordingly, a related art OLED display device requires an additional algorithm and circuit for processing and converting an image having NTSC color coordinate values so that the image can be represented by ITU-R BT.709 color coordinate values, which leads to an increase of manufacturing cost.

Additionally, since the related art OLED display device does not satisfy the color reproduction range of the ITU-R BT.709 directly, it requires an additional algorithm for representing the color reproduction range of the ITU-R BT.709. Implementation of this additional algorithm also requires an accompanying circuit.

SUMMARY OF THE INVENTION

Accordingly, the present invention is directed to an organic light-emitting diode (OLED) display device that substantially obviates one or more of the problems due to limitations and disadvantages of the related art.

An object of the present disclosure is to provide an OLED display device capable of satisfying the color reproduction range of the ITU-R BT.709 by extending a light-emitting layer formed in each sub-pixel area to its neighboring sub-pixel area without having to use a separate algorithm and an additional driving circuit, and a method of manufacturing the OLED display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an organic light-emitting diode (OLED) display device, including: a first substrate on which a plurality of sub-pixel areas are defined; a plurality of first electrodes in the plurality of sub-pixel areas, respectively; and a plurality of light-emitting layers over the plurality of first electrodes and corresponding to the plurality of sub-pixel areas, respectively; wherein at least one of the plurality of light-emitting layers extends to a neighboring sub-pixel area among the plurality of sub-pixel areas, and has an occupied area in the neighboring sub-pixel area.

In another aspect, there is provided a method of manufacturing an organic light-emitting diode (OLED) display device including a first substrate in which a plurality of sub-pixel areas are defined, a plurality of first electrodes in the plurality of sub-pixel areas, and a plurality of light-emitting layers over the plurality of first electrodes and corresponding to the plurality of sub-pixel areas, respectively, wherein at least one of the plurality of light-emitting layers extends to a neighboring sub-pixel area among the plurality of sub-pixel areas, and has an occupied area in the neighboring sub-pixel area, the method including: aligning a fine metal mask that corresponds to the first light-emitting layer and has a wider pattern than the first sub-pixel area, on the substrate, and depositing a host and dopant for forming the first light-emitting layer to thereby form the first light-emitting layer; aligning a fine metal mask that corresponds to the second light-emitting layer and has a narrower pattern than the second sub-pixel area, on the substrate, and depositing a host and dopant for forming the second light-emitting layer to thereby form the second light-emitting layer; and aligning a fine metal mask having a pattern that corresponds to the third light-emitting layer, on the substrate, and depositing a host and dopant for forming the third light-emitting layer to thereby form the third light-emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EMBODIMENTS

Reference will now be made in detail to the embodiments, examples of which are illustrated in the accompanying drawings.

Figure 4:
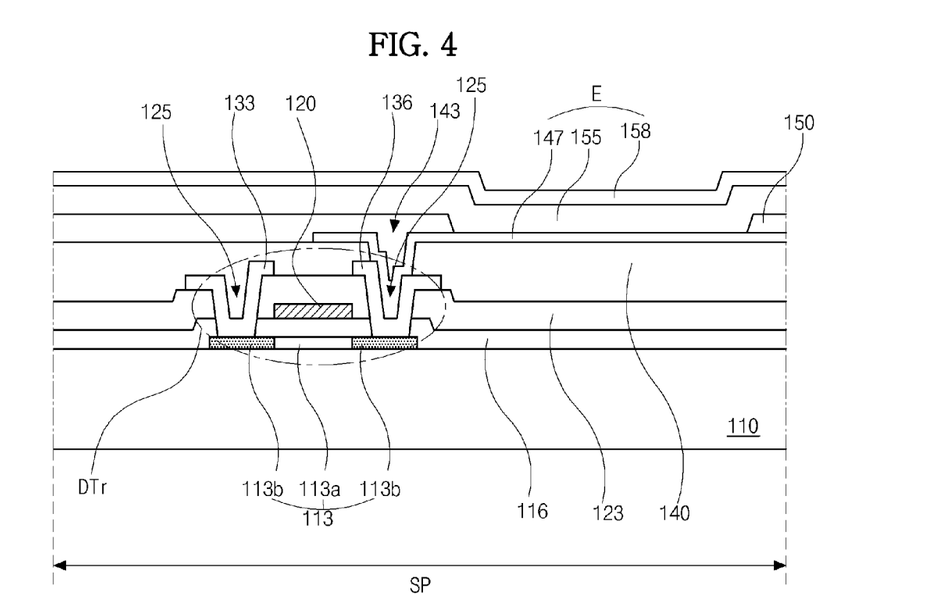
FIG. 4 is an example showing the cross-section of a sub-pixel area of an OLED display device according to an embodiment of the present invention.

FIG. 4 is an example showing the cross-section of a sub-pixel area of an organic light-emitting diode (OLED) display device according to an embodiment of the present invention;

As shown in FIG. 4, a sub-pixel area SP is defined on a substrate 110.

The substrate 110 may be made of a transparent glass material, a transparent plastic material having excellent flexibility, or a polymer film.

The sub-pixel area SP may include red, green, and blue sub-pixel areas (R, G, and B of FIG. 4) that emit red, green, and blue lights, respectively.

Also, in the sub-pixel area SP, a switching thin film transistor (not shown) and a driving transistor DTr are formed, and a first electrode (for example, an anode electrode) 147 is formed to be connected to the drain electrode 136 of the driving transistor DTr.

Figure 5:
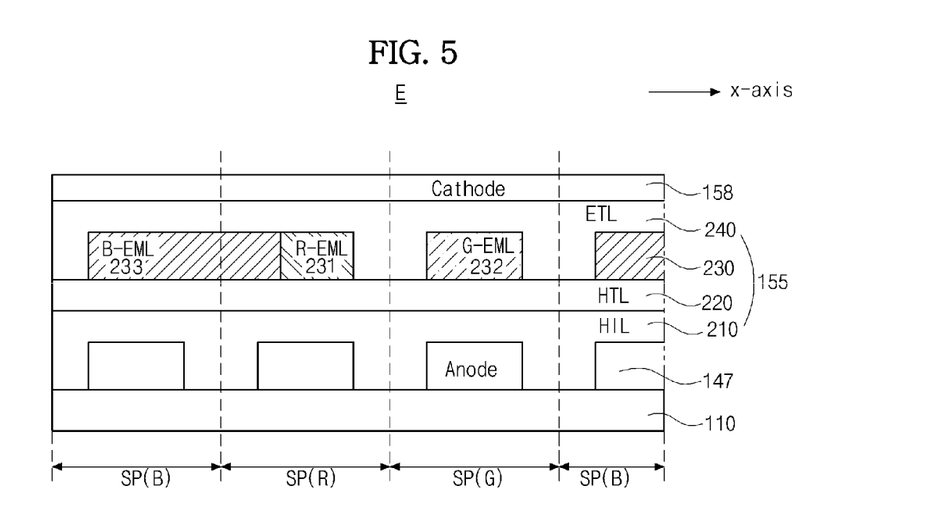
FIG. 5 is a cross-sectional view schematically showing a part of the OLED display device shown in FIG. 4, and shows light-emitting diodes formed in red, green, and blue sub-pixel areas.

An emission material layer 155 is formed on the first electrode 147, and the emission material layer 155 may have different patterns in correspondence to the red, green, and blue sub-pixel areas (R, G, and B of FIG. 5). This will be described in more detail with reference to FIG. 5, later.

In more detail, at a location where the driving transistor DTr will be formed on the substrate 110, a semiconductor layer 113 including a first area 113a and second areas 113b is formed, wherein the first area 113a is made of polysilicon and configures a channel, and the second areas 113b are formed at both sides of the first area 113a and doped with a high concentration of impurities. An insulating layer (not shown) made of a non-organic material, such as $SiO_2$ or $SiN_x$, may be formed between the semiconductor layer 113 and the substrate 110 to cover the entire surface of the substrate 110. The reason for forming an insulating layer below the semiconductor layer 113 is to prevent the properties of the semiconductor layer 113 from deteriorating due to alkali ions emitted from the substrate 110 upon crystallization of the semiconductor layer 113.

Also, a gate insulating film 116 is formed on the entire area of the substrate 110 to cover the semiconductor layer 113, and a gate electrode 120 is formed on the gate insulating film 116 in correspondence to the first area 113a of the semiconductor layer 113.

Also, on the gate insulating film 116, a gate line (not shown) connected to the gate electrode 120 of the driving transistor DTr and extending in one direction is formed. Also, the gate electrode 120 and the gate line may be formed of a first metal material having low resistance, for example, a material selected from among aluminum (Al), an aluminum alloy (AlNd), copper (Cu), a copper alloy, molybdenum (Mo), and moly-titanium (MoTi).

Meanwhile, an interlayer insulating film 123 made of an insulating material (for example, $SiO_2$ or $SiN_x$ which are non-organic insulting materials) is formed on the gate electrode 120 and the gate line over the remaining sub-pixel SP area of the first substrate 110. Semiconductor layer contact holes 125 are formed in the interlayer insulating film 123 and the gate insulating film 116 to expose the second areas 113b of the semiconductor layer 113.

Also, a data line (not shown) and a power line (not shown) are formed on the interlayer insulating film 123 including the semiconductor layer contact holes 125. The data line and the power line cross the gate line to define a sub-pixel area SP, and are formed of a second metal material which is at least one material selected from among aluminum (Al), an aluminum alloy (AlNd), copper (Cu), a copper alloy, molybdenum (Mo), moly-titanium (MoTi), chrome (Cr), and titanium (Ti). The power line may be formed on the layer (that is, the gate insulating film 116) on which the gate line is formed, and spaced apart from the gate line.

Source and drain electrodes 133 and 136 are formed on the interlayer insulating film 123. The source and drain electrodes 133 and 136 are spaced apart from each other, and contact the second areas 113b exposed through the semiconductor layer contact holes 125. The source and drain electrodes 133 and 136 are made of the same second metal material as the data line.

The semiconductor layer 113, the gate insulating film 116, the gate electrode 120, and the interlayer insulating film 123 that are sequentially applied form a driving transistor DTr together with the source and drain electrodes 133 and 136 spaced apart from each other.

Although not shown in the drawing, a switching transistor having the same layered structure as the driving transistor DTr is formed on the substrate 110.

Meanwhile, a protection layer 140 having a drain contact hole 143 that exposes the drain electrode 136 of the driving transistor DTr is formed on the driving transistor DTr.

Also, a first electrode 147 is formed on the protection layer 140, and contacts the drain electrode 136 of the driving transistor DTr through the drain contact hole 143.

Then, a bank 150 is formed in the boundary of the sub-pixel area SP on the first electrode 147. The bank 150 is made of an insulating material, specifically, an organic insulating material, for example, benzo cyclo butadiene (BCB), polyimide resin, or photo acryle. The bank 150 may overlap the edge of the first electrode 147 in a manner to surround the sub-pixel area SP.

An emission material layer 155 is formed on the first electrode 147 in the sub-pixel area SP surrounded by the bank 150.

A second electrode 158 is formed on the emission material layer 155 and the bank 150.

The first electrode 147, the emission material layer 155, and the second electrode 158 form a light-emitting diode E.

Hereinafter, a light-emitting diode E formed in each of red, green, and blue sub-pixel areas will be described in more detail with reference to FIG. 5.

FIG. 5 is a cross-sectional view schematically showing a part of the OLED display device shown in FIG. 4, and shows light-emitting diodes formed in red, green, and blue sub-pixel areas R, G, and B.

As shown in FIG. 5, the red, green, and blue sub-pixel areas R, G, and B are defined on the substrate 110.

Also, each of the red, green, and blue sub-pixel areas R, G, and B includes the first electrode 147, the second electrode 158, and the emission material layer 155 formed between the first and second electrodes 147 and 158.

In detail, the first electrode 147 is formed in correspondence to each of the red, green, and blue sub-pixel areas R, G, and B on the substrate 110.

The second electrode 158 is formed on the entire red, green, and blue sub-pixel areas R, G, and B.

The emission material layer 155 may include a hole injecting layer (HIL) 210, a hole transport layer (HTL) 220, light-emitting layers 230, and an electron transport layer (ETL) 240.

The HIL 210 and HTL 220 are formed on the entire red, green, and blue sub-pixel areas R, G, and B, and function to facilitate injection and transportation of holes. One of the HIL 210 and the HTL 220 may be omitted and/or their functions may be combined in a single layer.

The ETL 240 formed on the entire red, green, and blue sub-pixel areas R, G, and B over the light-emitting layers 230 functions to facilitate transportation of electrons.

Although not shown in FIG. 5, an electron injection layer (EIL) may be further formed on the ETL 240 in order to facilitate injection of electrons.

The light-emitting layers 230 may include a red light-emitting layer (R-EML) 231, a green light-emitting layer (G-EML) 232, and a blue light-emitting layer (B-EML) 233 in the red, green, and blue sub-pixel areas R, G, and B, respectively.

At least one of the red, green, and blue light-emitting layers 231, 232, and 233 may extend to a neighboring sub-pixel area.

For example, the blue light-emitting layer 233 formed in the blue sub-pixel area B may extend to its neighboring sub-pixel area R.

When at least one of the red, green, and blue light-emitting layers 231, 232, and 233 extends to a neighboring sub-pixel area SP, the amount of area in the neighboring sub-pixel area SP occupied by the extended light-emitting layer may be set based on the desired color reproduction range that is to be implemented.

For example, an area by which a light-emitting layer 230 formed in a sub-pixel area SP occupies its neighboring sub-pixel area may be adjusted such that the color reproduction range of the OLED display satisfies the expected HDTV color range for accurately producing an image according to a given color coordinate standard (i.e., ITU-R BT.709).

Generally, a display processes images according to the ITU-R BT.709, however, the processed images may be transmitted based on the NTSC, and the color reproduction range of the NTSC is different from the color reproduction range of the ITU-R BT.709. Accordingly, a light-emitting layer 230 formed in a sub-pixel area SP may extend to its neighboring sub-pixel area such that an image having color coordinate values of the NTSC standard can be represented by color coordinate values of the ITU-R BT.709. When each sub-pixel area is driven, color reproduction by a light-emitting layer corresponding to the sub-pixel area is done together with color reproduction by a part of the light-emitting layer extended to a neighboring sub-pixel, and color coordinate values of the ITU-R BT.709 or other standards can be met.

In the OLED display device according to the present embodiment, when the blue sub-pixel area B is driven, the blue light-emitting layer 233 corresponding to the first electrode 147 formed in the blue sub-pixel area B emits light, and when the red sub-pixel area R is driven, the blue light-emitting layer 233 and the red light-emitting layer 231 formed on the first electrode 147 in the red sub-pixel area R emit light. Thereby, the OLED display device produces the desired color when driving a given sub-pixel area R.

First Embodiment

An OLED display device according to a first embodiment will be described in detail with reference to FIGS. 6 and 7.

Figure 6:
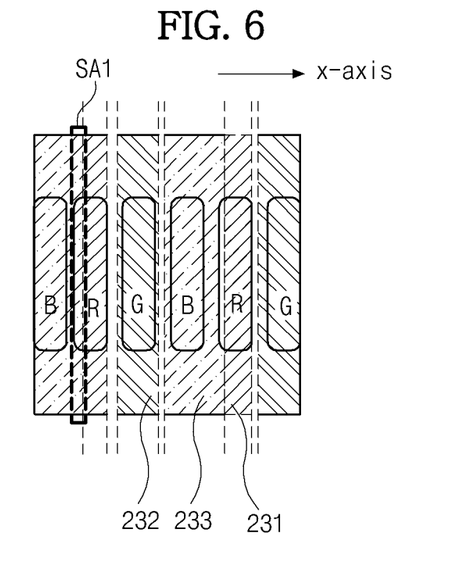
FIG. 6 is an example schematically showing an OLED display device according to a first embodiment of the present invention when it is seen from the front, and shows sub-pixel areas, and red, green, and blue light-emitting layers formed in the sub-pixel areas.
Figure 7:
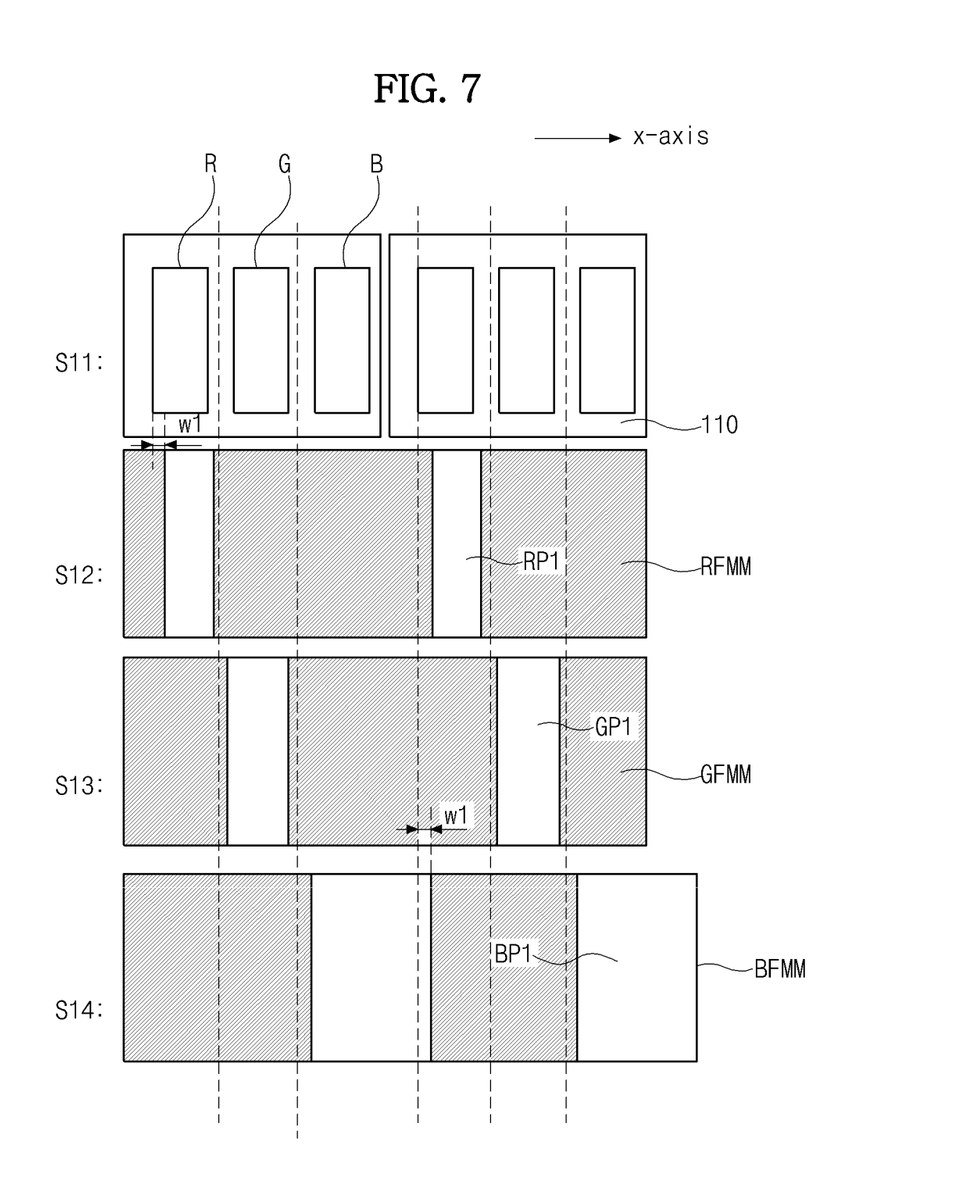
FIG. 7 is an example schematically showing processes of manufacturing the OLED display device shown in FIG. 6, and shows red, green, and blue sub-pixel areas, and fine metal masks used in the red, green, and blue sub-pixel areas, respectively.

FIG. 6 is an example schematically showing the OLED display device according to the first embodiment of the present invention when it is seen from the front, and shows sub-pixel areas, and red, green, and blue light-emitting layers formed on the sub-pixel areas, and FIG. 7 is an example schematically showing processes of manufacturing the OLED display device shown in FIG. 6, and shows red, green, and blue sub-pixel areas, and fine metal masks used in the red, green, and blue sub-pixel areas, respectively.

As shown in FIG. 6, red, green, and blue sub-pixel areas R, G, and B are sequentially arranged in an x-axis direction, and red, green, and blue light-emitting layers 231, 232, and 233 are sequentially arranged on the red, green, and blue sub-pixel areas R, G, and B, respectively, in the x-axis direction.

The blue light-emitting layer 233 extends to the red sub-pixel area R, as well as the blue sub-pixel area B.

A first occupied area SA1 of the red sub-pixel area R by the blue light-emitting layer 233 may be 3-8% of the red sub-pixel area R, and preferably, about 1/15 (about 6-7%) of the red sub-pixel area R.

The first occupied area SA1 may be set to an arbitrary area capable of representing color coordinates of the ITU-R BT.709.

Now, a method of manufacturing the OLED display device shown in FIG. 6 will be briefly described with reference to FIG. 7, below.

As shown in FIG. 7, in first operation S11, a substrate 110 on which red, green, and blue sub-pixel areas R, G, and B are sequentially defined in an x-axis direction, is prepared.

Successively, in second operation S12, a red fine metal mask RFMM for forming red light-emitting layers (231 of FIG. 6) is aligned on the substrate 110, and a host and dopant for forming the red light-emitting layers 231 are deposited to thereby form the red light-emitting layers 231.

Patterns RP1 of the RFMM may be aligned in correspondence to locations spaced by first widths w1 from one sides of the red sub-pixel areas R. The reason is to form blue light-emitting layers (233 of FIG. 6) in areas corresponding to the first widths w1 of the red sub-pixel areas R. That is, the patterns RP1 of the RFMM may be smaller than the red sub-pixel areas R (e.g., by width w1) such that the patterns BP1 of the blue fine metal mask BFMM may form a blue light-emitting layer in a portion (e.g., width w1) of the red sub-pixel area R.

Successively, in third operation S13, a green fine metal mask GFMM for forming green light-emitting layers (232 of FIG. 6) is aligned on the substrate 110, and a host and dopant for forming the green light-emitting layers 232 are deposited to thereby form the green light-emitting layers 232.

Patterns GP1 of the GFMM may be aligned in correspondence to the green sub-pixel areas G. The reason is to form the green light-emitting layers 232 in the green sub-pixel areas G. That is, the patterns GP1 of the GFMM may be arranged at substantially the same locations as the green sub-pixel areas G.

Successively, in fourth operation S14, a blue fine metal mask BFMM for forming blue light-emitting layers (233 of FIG. 6) is aligned on the substrate 110, and a host and dopant for forming the blue light-emitting layers 233 are deposited to thereby form the blue light-emitting layers 233.

Patterns BP1 of the BFMM may be aligned in correspondence to the blue sub-pixel areas B, and also extend to the first widths w1 of the red sub-pixel areas R. The reason is to form the blue light-emitting layers 233 in areas corresponding to the first widths w1 of the red sub-pixel areas R, as well as in the blue sub-pixel areas B. That is, patterns BP1 of the BFMM may be larger than the blue sub-pixel areas B.

The embodiment described above corresponds to sequentially forming the red, green, and blue light-emitting layers 231, 232, and 233. However, this is only exemplary, and the red, green, and blue light-emitting layers 231, 232, and 233 may be formed in a different order.

Also, forming the red, green, and blue light-emitting layers 231, 232, and 233 using the FMMs is only exemplary, and the red, green, and blue light-emitting layers 231, 232, and 233 may be formed using other methods, such as laser induced thermal imaging (LITI), laser induced plasma spectroscopy (LIPS), etc.

Hereinafter, a color reproduction range of the OLED display device shown in FIG. 6 will be described with reference to FIG. 8.

Figure 8:
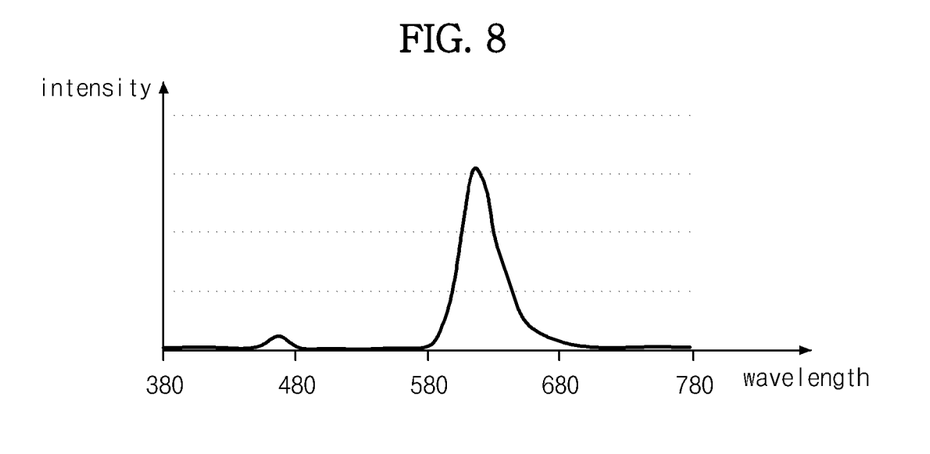
FIG. 8 shows a luminescence spectrum of a red sub-pixel area of the OLED display device shown in FIG. 6.

FIG. 8 shows a luminescence spectrum of a red sub-pixel area of the OLED display device shown in FIG. 6.

As shown in FIG. 8, the luminescence spectrum of the red sub-pixel area shows a luminescence peak at a wavelength corresponding to red light, and also shows low intensity of light at a wavelength corresponding to blue light. In other words, the red sub-pixel area emits blue light together with red light.

A color reproduction range of the red sub-pixel area (R of FIG. 6) will be described with reference to Table 3.

Table 3 shows ITU-R BT.709 color coordinate values that represent light transmission of the red sub-pixel area R, based on coordinator values designated by the International Commission on Illumination (CIE) in 1931.

TABLE 3

|  | x | Y |
|---|---|---|
| Red Sub-pixel Area | 0.64 | 0.33 |
| Green Sub-pixel Area | 0.19 | 0.75 |
| Blue Sub-pixel Area | 0.14 | 0.06 |

First, in regard to the red sub-pixel area R, an x-axis value is 0.064, and a y-axis value is 0.33, and the results are the same as color coordinate values of a red sub-pixel area of the ITU-R BT.709.

By further forming a blue light-emitting layer (233 of FIG. 6) in each red sub-pixel area R, the same red color the ITU-R BT.709 represents can be reproduced. Accordingly, it is possible to provide an OLED display device with excellent color quality.

Second Embodiment

An OLED display device according to a second embodiment will be described in detail with reference to FIGS. 9 and 10.

Figure 9:
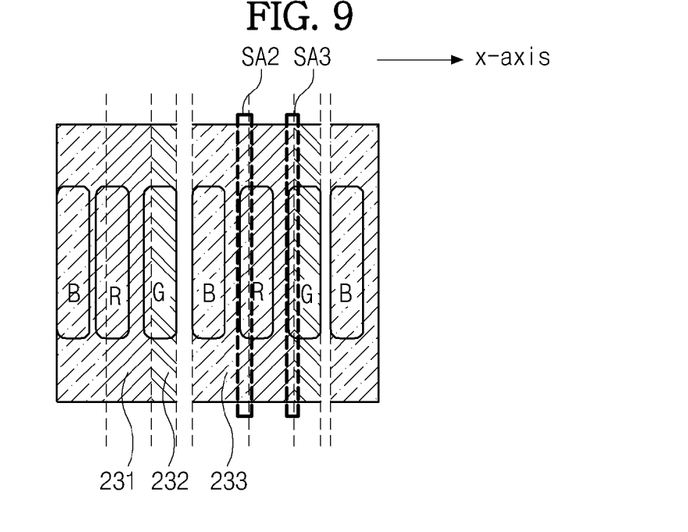
FIG. 9 is an example schematically showing an OLED display device according to a second embodiment of the present invention when it is seen from the front, and shows sub-pixel areas, and red, green, and blue light-emitting layers formed in the sub-pixel areas.
Figure 10:
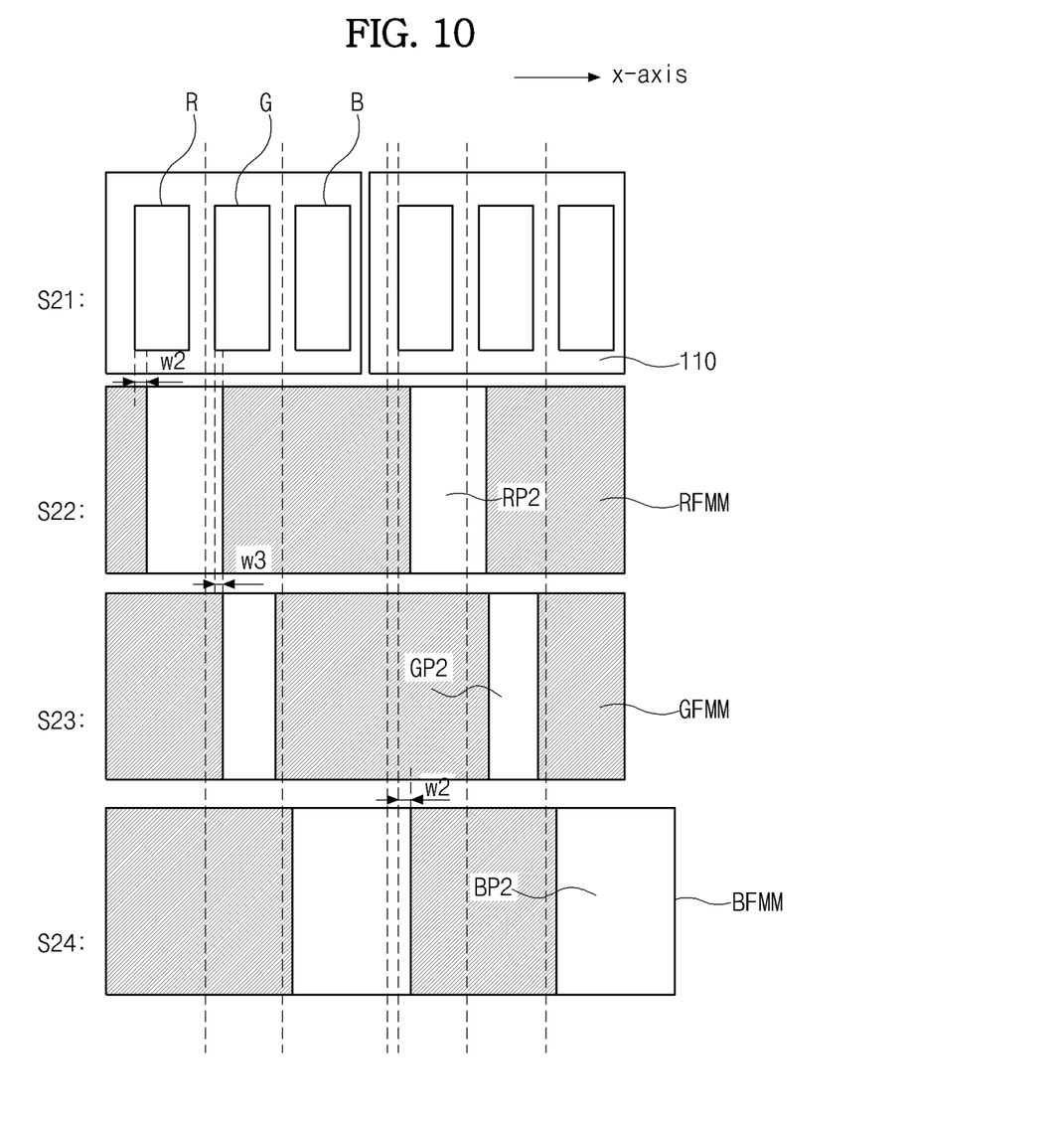
FIG. 10 is an example schematically showing processes of manufacturing the OLED display device shown in FIG. 9, and shows red, green, and blue sub-pixel areas, and fine metal masks used in the red, green, and blue sub-pixel areas, respectively.

FIG. 9 is an example schematically showing the OLED display device according to the second embodiment of the present invention when it is seen from the front, and shows sub-pixel areas, and red, green, and blue light-emitting layers formed on the sub-pixel areas, and FIG. 10 is an example schematically showing processes of manufacturing the OLED display device shown in FIG. 9, and shows red, green, and blue sub-pixel areas, and fine metal masks used in the red, green, and blue sub-pixel areas, respectively.

First, as shown in FIG. 9, the red, green, and blue sub-pixel areas R, G, and B are sequentially arranged on a substrate (110 of FIG. 10) in an x-axis direction, and red, green, and blue light-emitting layers 231, 232, and 233 are sequentially arranged in the red, green, blue sub-pixel areas R, G, and B, respectively, in the x-axis direction.

The blue light-emitting layer 233 formed in the blue sub-pixel area B extends to its neighboring red sub-pixel area R.

A second occupied area SA2 of the red sub-pixel area R by the blue light-emitting layer 233 may be 3-8% of the red sub-pixel area R, and preferably, about 1/15 (about 6-7%) of the red sub-pixel area R.

Also, the red light-emitting layer 231 formed in the red sub-pixel area R extends to its neighboring green sub-pixel area G.

A third occupied area SA3 of the green sub-pixel area G by the red light-emitting layer 231 may be about 15-20% of the green sub-pixel area G, and preferably, about 1/6 (about 16-17%) of the green sub-pixel area G.

The second and third occupied areas SA2 and SA3 may be set to arbitrary areas capable of representing color coordinates of the ITU-R BT.709.

Now, a method of manufacturing the OLED display device shown in FIG. 9 will be described with reference to FIG. 10.

As shown in FIG. 10, in first operation S21, a substrate 110 on which red, green, and blue sub-pixel areas R, G, and B are sequentially defined, is prepared.

Successively, in second operation S22, a red fine metal mask RFMM for forming red light-emitting layers (231 of FIG. 9) is aligned on the substrate 110, and a host and dopant for forming the red light-emitting layers 231 are deposited to thereby form the red light-emitting layers 231.

Patterns RP2 of the RFMM may be aligned in correspondence to locations spaced by second widths w2 from one sides of the red sub-pixel areas R, and also extend to third widths w3 of green sub-pixel areas G.

The reason is to form blue light-emitting layers (233 of FIG. 9) in areas corresponding to the second widths w2 of the red sub-pixel areas R, and to form red light-emitting layers 231 in areas corresponding to the third widths w3 of the green sub-pixel areas G.

Successively, in third operation S23, a green fine metal mask (GFMM) for forming green light-emitting layers (232 of FIG. 9) is aligned on the substrate 110, and a host and dopant for forming the green light-emitting layers 232 are deposited to thereby form the green light-emitting layers 232.

Patterns GP2 of the GFMM may be aligned in correspondence to locations spaced by third widths w3 from one sides of the green sub-pixel areas G. The reason is, as described above, to form red light-emitting layers 231 in areas corresponding to the third widths w3 of the green sub-pixel areas G.

Successively, in fourth operation S24, a blue fine metal mask (BFMM) for forming blue light-emitting layers 233 is aligned on the substrate 110, and a host and dopant for forming the blue light-emitting layers 233 are deposited to thereby form the blue light-emitting layers 233.

Patterns BP2 of the BFMM may be aligned in correspondence to the blue sub-pixel areas B, and also extend to the second widths w2 of the red sub-pixel areas R. The reason is to form the blue light-emitting layers 233 in areas corresponding to the second widths w2 of the red sub-pixel areas R, as well as in the blue sub-pixel areas B.

The embodiment described above corresponds to the case of sequentially forming the red, green, and blue light-emitting layers 231, 232, and 233. However, this is only exemplary, and the red, green, and blue light-emitting layers 231, 232, and 233 are formed in a different order.

Also, forming the red, green, and blue light-emitting layers 231, 232, and 233 using the FMMs is only exemplary, and the red, green, and blue light-emitting layers 231, 232, and 233 may be formed using other methods, such as LITI, LIPS, etc.

Hereinafter, a color reproduction range of the OLED display device shown in FIG. 9 will be described with reference to FIG. 11.

Figure 11:
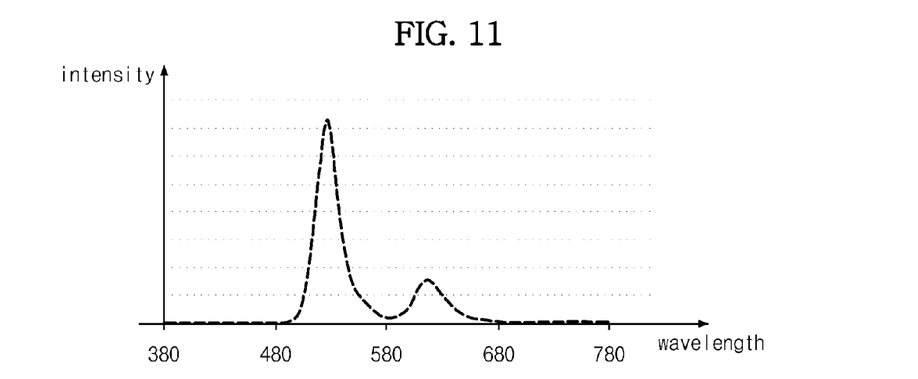
FIG. 11 shows a luminescence spectrum of a green sub-pixel area of the OLED display device shown in FIG. 9.

FIG. 11 shows a luminescence spectrum of a green sub-pixel area of the OLED display device shown in FIG. 9.

As shown in FIG. 11, the luminescence spectrum of the green sub-pixel area G shows a luminescence peak at a wavelength corresponding to green light, and also shows low intensity of light at a wavelength corresponding to red light. In other words, the green sub-pixel area G emits red light together with green light.

A color reproduction range of the green sub-pixel area G will be described with reference to Table 4.

Table 4 shows ITU-R BT.709 color coordinate values that represent light transmission of the green sub-pixel area G according to the second embodiment, based on coordinator values designated by the CIE in 1931.

TABLE 4

|  | X | Y |
|---|---|---|
| Red Sub-pixel Area | 0.64 | 0.33 |
| Green Sub-pixel Area | 0.30 | 0.65 |
| Blue Sub-pixel Area | 0.14 | 0.06 |

First, in regard to the green sub-pixel area G, an x-axis value is 0.30, and a y-axis value is 0.65, and the results are the same as color coordinate values of a green sub-pixel area of the ITU-R BT.709.

By further forming a red light-emitting layer (231 of FIG. 9) in each green sub-pixel area G, the same green color the ITU-R BT.709 represents can be reproduced. Accordingly, it is possible to provide an OLED display device with excellent color quality.

As described above, in the OLED display device, by extending light-emitting layers to neighboring sub-pixel areas, it is possible to ensure excellent color quality and provide improved image quality.

Also, since neither a complicated algorithm for representing the color reproduction range of the ITU-R BT.709 nor an additional driving circuit for executing the algorithm are needed, it is possible to reduce manufacturing cost and increase productivity.

Third Embodiment

An OLED display device according to a third embodiment will be described with reference to FIG. 12, below.

The same or similar components as those described in the first and second embodiments will not be described for simplicity of illustration, and will be designated by like numerals throughout.

Each first electrode 147 which is a reflection electrode includes a reflective metal layer and a transparent, conductive material layer. The reflective metal layer is formed of silver (Ag), aluminum (Al), arum (Au), platinum (Pt), chrome (Cr), or their alloys, and the transparent, conductive material layer is formed of a material having a high work function, such as indium tin oxide (ITO), indium zinc oxide (IZO), indium tin zinc oxide (ITZO), or AZO ($Al_2O_3$ doped with ZnO).

The second electrode 158 which is a semi-transparent electrode, may be formed of an alloy (Mg:Ag) of magnesium and silver. Or, the second electrode 158 may be formed of a metal, such as silver (Ag), aluminum (Ag), aurum (Au), platinum (Pt), or chrome (Cr), or an alloy containing such a metal.

The second electrode 158 may be formed with a thickness capable of achieving a reflectance of 5% or more, and a transmittance of 50%.

The first electrode 147 acts as a reflection electrode of reflecting light, and the second electrode 158 acts as a semi-transparent electrode of transmitting a part of light and reflecting the remaining part of the light.

Accordingly, a part of light emitted from the emission material layer 155 is emitted to the outside through the second electrode 158, and the remaining part of the light returns to the first electrode 147 since it cannot be transmitted through the second electrode 158.

In other words, light is repeatedly reflected between the first electrode 147 acting as a reflection layer and the second electrode 158, which is called a microcavity phenomenon.

That is, in the third embodiment, an optical resonance phenomenon of light is used to increase luminous efficiency and adjust luminescence purity of a light-emitting diode E.

Since different wavelengths of light are emitted from the respective emission material layers 155 of the red, green, and blue sub-pixel areas, the thickness of microcavity that is defined as the distance between the first electrode 147 and the second electrode 158 differs in the respective red, green, and blue sub-pixel areas.

In detail, if it is assumed that the distance between the first and second electrodes 147 and 158 in a red sub-pixel area R is a first distance d1, the distance between the first and second electrodes 147 and 158 in a green sub-pixel area G is a second distance d2, and the distance between the first and second electrodes 147 and 158 in a blue sub-pixel area B is a third distance d3, the first distance d1 of the red sub-pixel area R of emitting red light having a longest wavelength has the greatest value, and the third distance d3 of the blue sub-pixel area B of emitting blue light having a shortest wavelength has the smallest value and so on. That is, the first distance d1>the second distance d2>the third distance d3. As such, in order to adjust the first distance d1, the second distance d2, and the third distance d3, a red supplementary hole transport layer (R'HTL) 221 is formed in the red sub-pixel area R, and a green supplementary hole transport layer (G'HTL) 222 is formed in the green sub-pixel area G.

Figure 12:
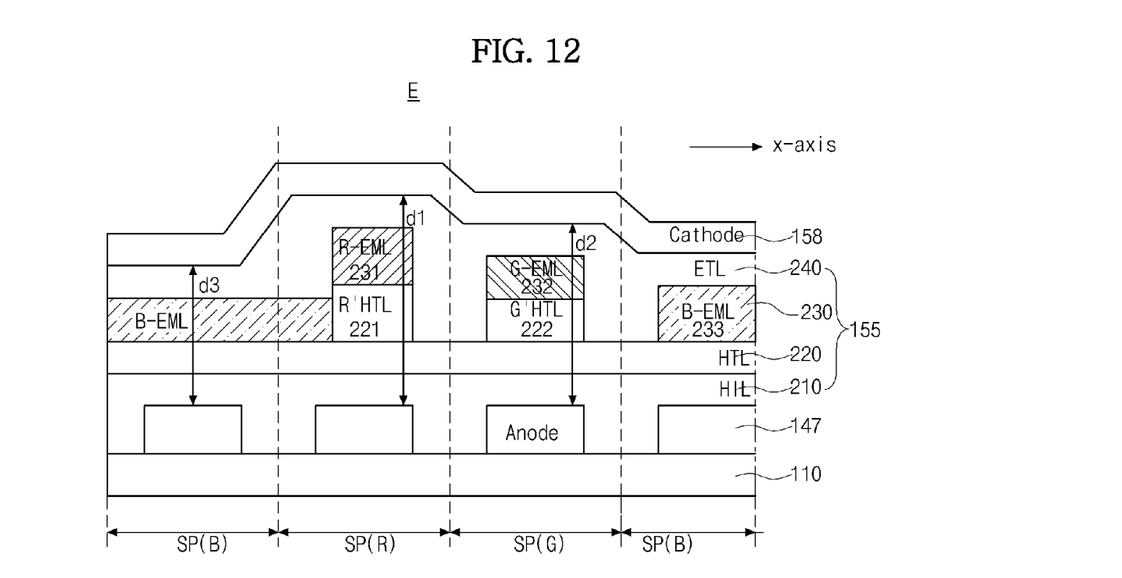
FIG. 12 is a cross-sectional view schematically showing a part of the OLED display device shown according to a third embodiment of the present invention.

Although not shown in FIG. 12, a capping layer may be further formed on the second electrode 158 in order to increase a light extraction effect.

Like the first and second embodiments, at least one of the red, green, and blue light-emitting layers 231, 232, and 233 may extend to a neighboring sub-pixel area R, G, or B, and a description thereof will be omitted.

The embodiments as described above relate to the color reproduction range of the ITU-R BT.709, however, the embodiments can be applied to various color coordinates that represent color reproduction ranges. For example, the embodiments as described above can be applied to ITU-R BT.706 of s-RGB, PAL, etc.

As described above, in the OLED display device, by extending a light-emitting layer formed in each sub-pixel area to its neighboring sub-pixel area, it is possible to natively represent the color coordinate values of the ITU-R BT.709 and provide improved image quality.

Also, since neither a complicated algorithm for satisfying the color reproduction range of the ITU-R BT.709 nor an additional driving circuit for executing the algorithm are needed, it is possible to reduce manufacturing cost.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light-emitting diode (OLED) display device, comprising:
   a first substrate on which a plurality of sub-pixel areas are defined, the plurality of sub-pixel areas including a first sub-pixel area and a second sub-pixel area that is adjacent to the first sub-pixel area;
   a plurality of first electrodes in the plurality of sub-pixel areas, respectively; and
   a plurality of light-emitting layers formed over the plurality of first electrodes and corresponding to the plurality of sub-pixel areas, respectively, the plurality of light-emitting layers including a first light-emitting layer in the first sub-pixel area and a second light-emitting layer in the second sub-pixel area;

wherein the first light-emitting layer in the first sub-pixel area extends into the second sub-pixel area among the plurality of sub-pixel areas, and the first light-emitting layer does not overlap with the second light emitting layer in the second sub-pixel area, and the first sub-pixel area emitting a color of light different from that of the second sub-pixel area adjacent to the first sub-pixel area, wherein the second light-emitting layer is formed only within the second sub-pixel area.

2. The OLED display device according to claim 1, wherein a distance the light-emitting layer extends to the neighboring sub-pixel area is adjusted such that the neighboring sub-pixel area has a color reproduction range of ITU-R BT.709.

3. The OLED display device according to claim 1, wherein the plurality of sub-pixel areas comprise first, second, and third sub-pixel areas that are sequentially arranged, wherein the plurality of light-emitting layers further comprise a third light-emitting layer, wherein the first light emitting layer, the second light emitting layer, and the third light emitting layer are sequentially arranged, wherein the second sub-pixel area comprises a first area adjacent to the first sub-pixel area, and a second area adjacent to the third sub-pixel area, wherein the third sub-pixel area comprises a third area adjacent to the second sub-pixel area, and a fourth area, wherein the first light-emitting layer is formed in correspondence to the first sub-pixel area and the first area, and wherein the second light-emitting layer is formed in correspondence to the second area, or in correspondence to the second area and the third area.

4. The OLED display device according to claim 3, wherein the first area is about 3% to about 8% of the second sub-pixel area, and the third area is about 15% to about 20% of the third sub-pixel area.

5. The OLED display device according to claim 3, wherein the first, second, and third sub-pixel areas are blue, red, and green sub-pixel areas, respectively.

6. A method of manufacturing an organic light-emitting diode (OLED) display device including a first substrate in which a plurality of sub-pixel areas are defined, a plurality of first electrodes in the plurality of sub-pixel areas, and a plurality of light-emitting layers over the plurality of first electrodes and corresponding to the plurality of sub-pixel areas, respectively, wherein at least one of the plurality of light-emitting layers extends to a neighboring sub-pixel area among the plurality of sub-pixel areas, the method comprising:

aligning a fine metal mask that corresponds to a first light-emitting layer and has a wider pattern than a first sub-pixel area, on the substrate, and depositing a host and dopant for forming the first light-emitting layer to thereby form the first light-emitting layer;

aligning a fine metal mask that corresponds to a second light-emitting layer and has a narrower pattern than a second sub-pixel area, on the substrate, and depositing a host and dopant for forming the second light-emitting layer to thereby form the second light-emitting layer; and aligning a fine metal mask having a pattern that corresponds to a third light-emitting layer, on the substrate, and depositing a host and dopant for forming the third light-emitting layer to thereby form the third light-emitting layer.

* * * * *